United States Patent
Tihanyi

(10) Patent No.: US 6,399,435 B1
(45) Date of Patent: Jun. 4, 2002

(54) METHOD FOR PRODUCING A DRAM CELL WITH A TRENCH CAPACITOR

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/913,422

(22) PCT Filed: Feb. 15, 2000

(86) PCT No.: PCT/DE00/00435

§ 371 (c)(1),
(2), (4) Date: Oct. 15, 2001

(87) PCT Pub. No.: WO00/49654

PCT Pub. Date: Aug. 24, 2000

(30) Foreign Application Priority Data

Feb. 19, 1999 (DE) .......................... 199 07 174

(51) Int. Cl.[7] .......................... H01L 21/8242
(52) U.S. Cl. .............. 438/248; 438/247; 438/246; 438/244; 438/243; 438/386; 438/387; 438/389; 438/390
(58) Field of Search ............... 438/243–249, 438/386–392

(56) References Cited

U.S. PATENT DOCUMENTS

| 5,181,089 A | | 1/1993 | Matsuo et al. | |
|---|---|---|---|---|
| 5,466,636 A | * | 11/1995 | Cronin et al. | 438/392 |
| 5,477,071 A | | 12/1995 | Hamamoto et al. | |
| 5,521,115 A | * | 5/1996 | Park et al. | 438/243 |
| 5,525,531 A | * | 6/1996 | Bronner et al. | 438/152 |
| 6,063,658 A | * | 5/2000 | Horak et al. | 438/248 |
| 6,074,909 A | * | 6/2000 | Gruening | 257/301 |
| 6,190,971 B1 | * | 2/2001 | Gruening et al. | 438/243 |
| 6,204,140 B1 | * | 3/2001 | Gruening et al. | 438/239 |

FOREIGN PATENT DOCUMENTS

| JP | 02065271 | 5/1990 |
|---|---|---|
| JP | 2-146766 | 6/1990 |
| JP | 7-161936 | 6/1995 |
| JP | 8-88330 | 4/1996 |

\* cited by examiner

Primary Examiner—John F. Niebling
Assistant Examiner—Jennifer M. Kennedy
(74) Attorney, Agent, or Firm—Jenkins & Wilson, P.A.

(57) ABSTRACT

The present invention provides a method for fabricating a DRAM cell having a trench capacitor. In order to simplify the fabrication method for a DRAM cell, to ensure a high yield and to achieve a high packing density of the DRAM cells, the invention proposes that the storage capacitor (4) of the DRAM cell and the selection transistor (3) be fabricated independently of one another. This saves method steps which, in the prior art, have to be carried out in order to isolate capacitor (9) and gate (16) in the same trench.

5 Claims, 1 Drawing Sheet

METHOD FOR PRODUCING A DRAM CELL WITH A TRENCH CAPACITOR

TECHNICAL FIELD

The present invention relates to a method for fabricating a DRAM cell having a trench capacitor.

RELATED ART

DRAM memories fall back upon the pulsed operation of SRAM memories. The capacitances always present in the memory cell, e.g. the gate capacitance, are used to retain its state for a certain time. This principle allows significant simplification of the memory cell, so that power consumption and area requirement decrease: the packing density of the memory increases. In order to increase the packing density even further, it is endeavored to further reduce the area requirement of DRAM cells. In this case, the aim is to keep the storage capacitance large and the stray capacitances of the bit and word lines as small as possible. At the same time, the fabrication methods for a DRAM chip should be as simple as possible.

U.S. Pat. No. 4,797,373 describes a DRAM memory cell and a fabrication method for a DRAM memory cell using trench technology. In the DRAM cell according to this prior art, the cell comprises a field-effect transistor and a storage capacitor, both the transistor and the capacitor being fabricated in a trench in a substrate. The source of the transistor, the channel and the drain and also one capacitor area are arranged essentially vertically in the side walls of the bulk substrate, and the gate and the other capacitor area are arranged in two regions of a material which is inserted into the trench and is insulated from the bulk by an insulator layer. In other words, the storage capacitor and the selection transistor are practically arranged one above the other under the crossover area of the bit and word lines.

The method for fabricating a DRAM memory cell having a storage capacitance and a selection transistor according to the above prior art essentially comprises the following steps:
- etching of a trench in a substrate of a first conductivity type;
- coating of the side areas of the trench with a first thin insulator layer;
- filling of the lined trench up to a predetermined height with conductive material of a second conductivity type;
- removal of the uncovered insulator layer including edge regions of the insulator layer between the conductive material and the substrate;
- deposition of a conductive material in the edge regions;
- diffusion of dopant from the conductive material through the edge regions into the substrate surrounding the trench, thereby producing, at the level of the edge regions in the substrate, weakly doped regions of the second conductivity type, which serve as the source of the selection transistor;
- formation of a drain region in the substrate adjacent to the upper part of the trench;
- formation of a gate insulator layer in the upper part of the trench; and
- filling of the rest of the trench with a conductive material serving as gate.

In this case, the substrate has a highly doped lower zone and a less highly doped upper zone, the source of the selection transistor being situated in the more weakly doped upper zone.

In this case, six essential steps concern the fabrication of the storage capacitance and of the gate of the selection transistor, and the remaining three steps exclusively concern the selection transistor. The method steps involve a significant difficulty in respect of carrying out the etching at the predetermined edge regions in a controlled manner, so that the dimensions of the predetermined edge regions are reproducible.

SUMMARY OF THE INVENTION

It is an object of the present invention to specify a fabrication method for a DRAM cell which is simple to carry out, has a high yield, permits a high packing density of the DRAM cells and reduces the interconnect capacitances.

This object is achieved by means of a method for fabricating a DRAM cell according to claim 1. The subclaims relate to preferred developments of the invention.

The invention is based on the idea of fabricating the DRAM cell by a method which has similar steps to the SOI method, namely in which a monocrystalline silicon layer is arranged on a support. Whereas in the SOI method the support is an insulator (SOI=silicon on insulator), in the "quasi-SOI" method according to the invention the monocrystalline silicon layer is produced as a second zone on a further silicon layer, which constitutes a first zone. The storage capacitance of the DRAM cell is produced in the first zone, and the selection transistor is produced in a silicon pillar in the second, upper zone. The invention's method for fabricating a DRAM memory cell thus has the steps of:
- producing a first trench in a first zone of a first conductivity type, coating the surface of the first trench with a first insulator layer and filling the first trench with a conductive material of a second conductivity type, the first zone and the conductive material in the first trench being highly doped;
- arranging a second zone of the first conductivity type on the first zone, so that the first trench is covered; producing a region of the second conductivity type in the second zone by diffusion of dopant from the conductive material in the first trench;
- etching adjacent regions next to the first trench, so that semiconductor material is removed proceeding from the surface right into the second zone;
- filling the adjacent regions with an insulator material, so that an insulator is produced between adjacent first trenches;
- producing bit lines made of conductive material of the second conductivity type and drain zones for selection transistors;
- producing the selection transistor in a second trench in the second zone above the first trench in the first zone; and
- producing word lines on the uncovered surface of the second zone.

Preferably, arranging the second zone on the first zone comprises the steps of "Direct Wafer Bonding" of the second zone on the first zone and thinning of the second zone to a predetermined thickness. This makes it possible to arrange the two differently doped zones on top of one another in a simple step. The thinning process can be effected by etching or by grinding and subsequent polishing.

In a preferred development of the method, the process of coating the surface of the first trench with an insulator layer is in each case effected by oxidation.

In particular, the adjacent regions of the first trench in which semiconductor material has been removed can be filled by a thick oxide. This is possible in a simple work step.

One advantage of the invention is that fewer masks are required during fabrication, i.e. only five masks in the exemplary embodiment compared with six in the comparable prior art. A further advantage is that the parasitic capacitances of the DRAM memory cell remain smaller with the method according to the invention than in the methods according to the prior art.

BRIEF DESCRIPTION OF THE DRAWING

Further features and advantages of the invention emerge from the following description of an exemplary embodiment illustrated in the drawing.

In the figures.

DETAILED DESCRIPTION OF THE INVENTION

Figure 1:
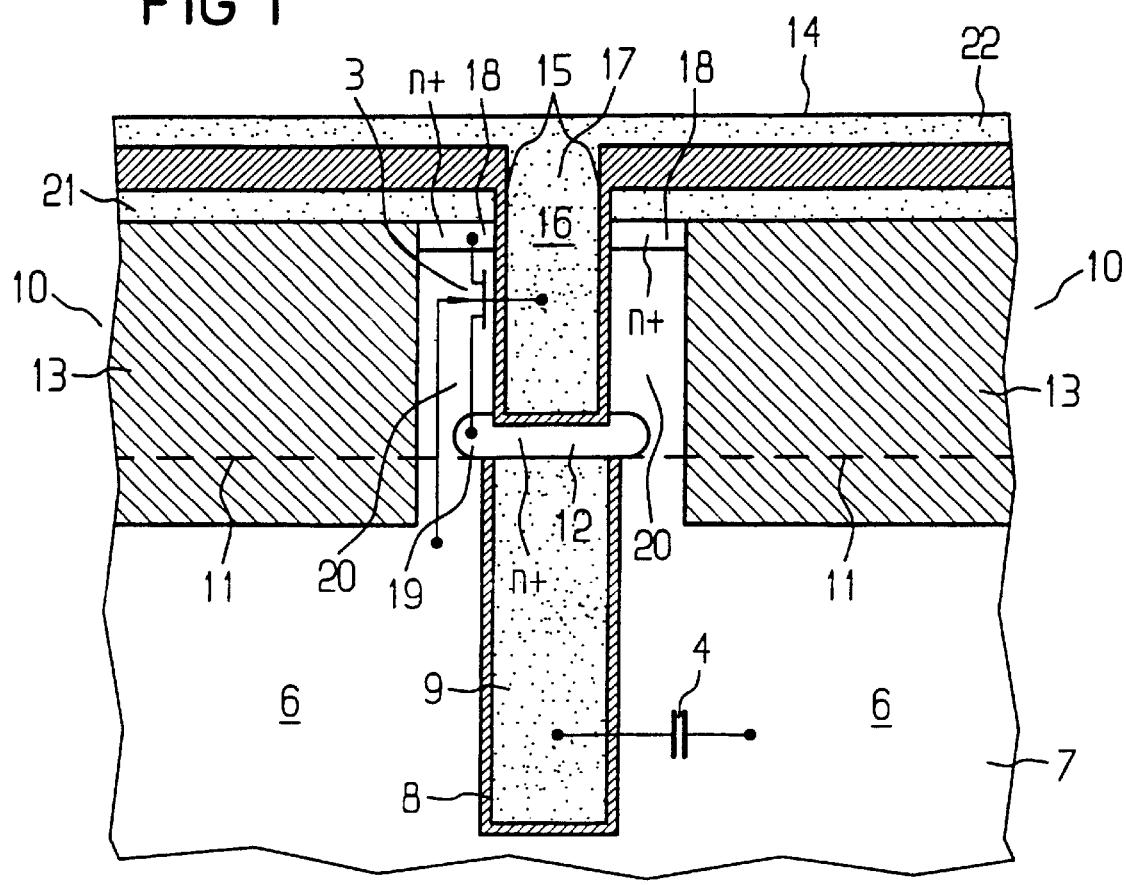
FIG. 1 shows a cross section through a DRAM cell which has been fabricated by the method according to the invention.

An embodiment of a DRAM cell which has been fabricated by the method according to the invention is illustrated in cross section in FIG. 1.

Figure 2:
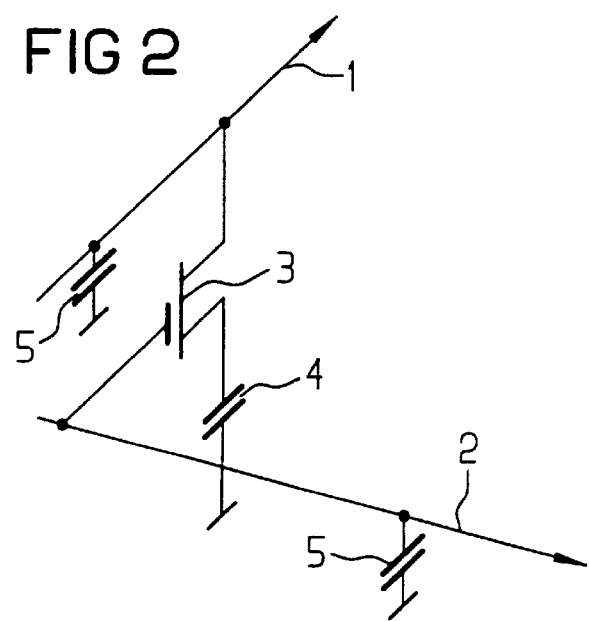
FIG. 2 shows the electrical equivalent circuit diagram of the DRAM cell according to FIG. 1.

In order to explain the circuitry requirements imposed on a DRAM cell, however, firstly the essential connections of the DRAM cell will be shown with reference to its electrical equivalent circuit diagram in FIG. 2.

A DRAM cell is situated at a point of intersection between a bit line 1 and a word line 2. The bit line is generally connected to the drain of a selection transistor 3, which is driven by the word line 2 via its gate. When the transistor is selected via the word line 2, it undergoes transition to its on state and connects a storage capacitor 4 to the bit line 1 for the writing or reading process.

Parasitic capacitances 5, which are unavoidable, form along the bit lines 1 and the word lines 2. However, since they adversely affect the switching behavior of the DRAM cell, attempts are made to keep them as small as possible. Their size depends, inter alia, on the method by which the DRAM cell is fabricated.

As already mentioned above, it is endeavored to keep the area requirement of an individual DRAM cell as small as possible. For this reason, today's DRAM cells are embodied with a stacked capacitor as storage capacitance or with a trench capacitor as storage capacitance. The present invention relates to DRAM cells having trench capacitors. The invention's method for fabricating a DRAM cell having a trench capacitor is explained with reference to FIG. 1.

Whereas the fabrication of the DRAM cell in the prior art involves producing a single trench in a semiconductor substrate, into which trench firstly an electrode of the storage capacitor and then the gate of the selection transistor are incorporated one after the other, the storage capacitor and the selection transistor are fabricated independently of one another in the method according to the invention. This saves method steps which, in the prior art, have to be carried out in order to isolate capacitor and gate in the same trench.

The invention's method for fabricating a DRAM memory cell having a trench capacitor is a "quasi-SOI" method (SOI=silicon on insulator). In the quasi-SOI method, monocrystalline silicon is grown on a further semiconductor—instead of on an insulator. This technique is distinguished by the fact that it is significantly simpler to carry out than methods according to the prior art.

In the method, in a first step, a first electrode of the storage capacitor 4 is fabricated as trench electrode. The trench capacitor 4 is depicted diagrammatically for the purpose of elucidation in FIG. 1. In order to fabricate the trench capacitor 4, a first trench 7 is produced in a first zone 6, as is generally known to the person skilled in the art. The first zone 6 is of a first conductivity type, i.e. of the p type in the exemplary embodiment shown. Afterward, the surface of the first trench 7 is coated with a first insulator layer 8. This insulator layer 8 may be an oxide layer of the surrounding semiconductor or the like. Finally, the first trench 7 is filled with a conductive material 9 of a second conductivity type, i.e. of the n type in the exemplary embodiment shown. In the embodiment shown, the conductive material 9 as polysilicon. Both the conductive material 9 and the first zone 6 in the first trench 7 are highly doped, i.e. $p^-$- and $n^-$-doped. The storage capacitance is thus formed by the $p^-$-type zone and the $n^-$-doped conductive material. The fabrication of the capacitor is referred to hereinafter as step a).

Once the capacitor has been produced in the first zone 6 in step a), in step b) a second zone 10 is arranged on the first zone 6, so that the first trench 7 in the first zone 6 is covered. This arrangement of the second zone 10 on the first zone 6 is preferably effected by means of techniques that are generally known to the person skilled in the art such as "Direct Wafer Bonding" or "Smart Cut". A sharply defined interface 11 between the first zone 6 and the second zone 10 can be produced in a simple manner by means of the "Direct Wafer Bonding" or "Smart Cut" method.

In order to bring the second zone 10 to a thickness which is suitable for the vertical extent of the selection transistor, the second zone 10, after being arranged on the first zone, is removed except for a residual layer, so that it subsequently has a predetermined thickness.

Like the first zone, the second zone 10 is of the first conductivity type, but it is doped more weakly than the first zone 6 for reasons which become clear further below.

In step c), a "bubble" region 12 is produced in the second zone 10. To that end, the ambient temperature is increased, so that dopant diffuses from the conductive material 9 in the first trench 7 via the interface 11 into the second zone 10. The bubble region 12 thus forms directly above the trench 7 in the first zone 6. The conductivity of said bubble region 12 is the same as that of the conductive material 9 in the trench 7, i.e. n or $n^-$.

After the "lower" part of the DRAM cell, i.e. the storage capacitance, has been completed in the previous steps a) to c), in the subsequent steps the cell is insulated from its adjacent cells (not illustrated) and the selection transistor is produced. In step d), adjacent regions are etched next to the first trench 7. During the etching process, the semiconductor material is removed proceeding from the surface right into the second zone 10, i.e. beyond the interface 11. "Adjacent region next to the first trench" is understood to mean the region which, as can be seen in FIG. 1, is situated laterally above and next to the trench in the first zone 6. The freely excavated adjacent regions are filled with an insulator material 13 again in step e), thereby producing an essentially planar surface. The insulating material 13 produces an insulator region between adjacent trenches. The insulator material 13 may have a plurality of layers. The adjacent regions of the first trench 7 are filled by a thick oxide or another insulator. In this case, the thickness of the insulator is preferably more than 1 µm. The bit line capacitance is consequently very small. After the adjacent regions have been filled, the surface of the DRAM cell, i.e. the surface of the residual semiconductor over the (buried) trench 7 and of the insulator material 13, is planarized.

In step f), bit lines 21 are produced on the planarized surface. The bit lines 21 are formed from conductive material such as polysilicon, Al or W and are of the second conductivity type. Adjoining the bit lines 21, drain zones 18 for the selection transistor 3 are formed, preferably by diffusion of dopant from the conductive material 21 for the bit line 1. The selection transistor itself is fabricated in an "Si pillar" in step g). To that end, a second trench 14 is produced in the second zone 10 above the first trench 7 in the first zone 6. The second trench 14 is fabricated in a similar manner to the first trench 7 and is filled with a gate insulator layer 15 and also an (insulated) gate material 16, thereby producing a gate 17 of the selection transistor. The gate material 16 is preferably polysilicon like the conductive material 9 in the first trench 7, said polysilicon being n- or n$^-$-doped in the embodiment shown. The selection transistor 3 is depicted diagrammatically in FIG. 1 for elucidation purposes.

Step g) completes a selection transistor whose drain 18 is contiguous with the conductive material 21 of the bit line 1, whose source 19 is the n$^-$-doped bubble region 12 produced by diffusion, and whose gate 17 controls the charge carrier transport through a channel 20 of the selection transistor. For error-free functioning of the selection transistor, it must be ensured that the capacitance of the np junction at the source 19 remains smaller than the capacitance of the storage capacitor 4, which is formed by the conductive material 9 in the first trench 7 and the first zone 6. This is achieved by the different doping of the first zone 6 and of the second zone 10. The method, in which storage capacitor and selection transistor are fabricated in a manner "isolated" from one another and are connected to one another by wafer bonding, thus affords a further advantage in that a very abrupt transition in the doping profile between first zone 6 and second zone 10 is simple to realize.

The DRAM cell is completed in step h), in which conductive material 22 for the word lines 2 is deposited on the uncovered surface of the second zone 10. As in the case of the bit lines, this material is likewise preferably polysilicon, Al or W.

In the above method steps, the process of coating with an insulator layer 8 or 15 is preferably effected by oxidation of the semiconductor material. The method can thus be simplified further.

To summarize, the essential features of the method according to the invention in the embodiment shown are thus that the storage capacitor is embodied in a p$^-$-type zone as trench capacitance with gate oxide and n$^-$-type polysilicon. The selection transistor is situated in an Si pillar. This pillar is partly p$^-$-doped and partly p-doped. The p-/p$^-$-type zones are bonded together by "Direct Wafer Bonding" or by "Smart Cut" after the fabrication of the trench for the storage capacitor with an insulated polysilicon filling. The n$^-$-type bubble region is produced from the n$^-$-type polysilicon by diffusion. The silicon pillars are then etched deeply into the p$^-$-type zone, the interspaces are filled with insulator, and the wafer is then planarized by a customary method. After the bit lines made of n$^-$-type polysilicon have been produced and the n$^-$-doped drain zones for the selection transistors have been prepared, the processes of trench etching, oxidation and filling are effected for the selection transistor having a vertical channel. Its insulated gate filling (e.g. n$^-$-type polysilicon with metal surface) simultaneously serves as a word line.

The total area of the DRAM cell fabricated by the method according to the invention is hardly larger than the crossing area of the bit and word lines. Furthermore, only about five masks are necessary for the cell fabrication according to the above method.

Although the present invention has been described above using preferred exemplary embodiments, It is not restricted thereto, but rather can be modified in diverse ways.

In particular, the two trenches need not be oriented exactly vertically above one another, but rather may be offset with respect to one another, as long as the bubble region reaches the gate insulation layer of the upper trench.

What is claimed is:

1. A method for fabricating a DRAM memory cell having a trench capacitor, which comprises the steps of:

producing a first trench in a first zone of a first conductivity type, coating the surface of the first trench with a first insulator layer and filling the first trench with a conductive material of a second conductivity type, the first zone and the conductive material in the first trench being highly doped;

arranging a second zone of the first conductivity type on the first zone, so that the first trench is covered;

producing a region of the second conductivity type in the second zone by diffusion of dopant from the conductive material in the first trench;

etching adjacent regions next to the first trench, so that semiconductor material is removed proceeding from the surface of the second zone right into the first zone;

filling the adjacent regions with an insulator material, so that an insulator region is produced between adjacent trenches;

producing bit lines made of the conductive material of the second conductivity type and drain zones for selection transistors on the surface of the second zone;

producing the selection transistor in a second trench in the second zone above the first trench in the first zone; and producing word lines made of the conductive material on the uncovered surface of the second zone.

2. The method as claimed in claim 1, wherein arranging the second zone on the first zone comprises the steps of "Direct Wafer Bonding" of the second zone on the first zone and thinning of the second zone to a predetermined thickness.

3. The method as claimed in claim 1, wherein the process of coating with an insulator layer is effected by oxidation of the semiconductor material.

4. The method as claimed in claim 1, wherein the adjacent regions of the first trench are filled by a thick oxide.

5. The method as claimed in claim 1, wherein the insulator material comprises a plurality of layers.

* * * * *